(12) United States Patent
Wiepking et al.

(10) Patent No.: US 7,193,173 B2
(45) Date of Patent: Mar. 20, 2007

(54) REDUCING PLASMA IGNITION PRESSURE

(75) Inventors: Mark Wiepking, Santa Clara, CA (US); Bradford J. Lyndaker, San Jose, CA (US); Andras Kuthi, Thousand Oaks, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/883,583

(22) Filed: Jun. 30, 2004

(65) Prior Publication Data

US 2006/0011590 A1    Jan. 19, 2006

(51) Int. Cl.
*B23K 10/00* (2006.01)

(52) U.S. Cl. .......................... 219/121.43; 219/121.41; 219/121.54

(58) Field of Classification Search .............. 219/121.4, 219/121.41, 121.43, 121.44, 121.57, 121.54; 118/723 I, 723 R; 156/345.44, 345.51; 204/298.15
See application file for complete search history.

(56) References Cited

U.S. PATENT DOCUMENTS

| | | | |
|---|---|---|---|
| 5,793,192 A | | 8/1998 | Kubly et al. |
| 6,057,244 A | * | 5/2000 | Hausmann et al. ......... 438/706 |
| 6,562,190 B1 | | 5/2003 | Kuthi et al. |
| 2004/0025791 A1 | * | 2/2004 | Chen et al. .................. 118/728 |
| 2004/0134768 A1 | * | 7/2004 | Wang et al. ........... 204/192.17 |
| 2005/0051100 A1 | * | 3/2005 | Chiang et al. .............. 118/728 |

OTHER PUBLICATIONS

PCT International Search Report mailed May 26, 2006, re PCT/US05/21098.
PCT Written Opinion mailed May 26, 2006, re PCT/US05/21098.

* cited by examiner

*Primary Examiner*—Mark Paschall
(74) *Attorney, Agent, or Firm*—IP Strategy Group, P.C.

(57) ABSTRACT

A method in a plasma processing system for processing a semiconductor substrate is disclosed. The plasma processing system includes a plasma processing chamber and an electrostatic chuck coupled to a bias compensation circuit. The method includes igniting a plasma in a plasma ignition step. Plasma ignition step is performed while a first bias compensation voltage provided by the bias compensation circuit to the chuck is substantially zero and while a first chamber pressure within the plasma processing chamber is below about 90 mTorr. The method further includes processing the substrate in a substrate-processing step after the plasma is ignited. The substrate-processing step employs a second bias compensation voltage provided by the bias compensation circuit that is higher than the first bias compensation voltage and a second chamber pressure substantially equal to the first chamber pressure.

39 Claims, 4 Drawing Sheets

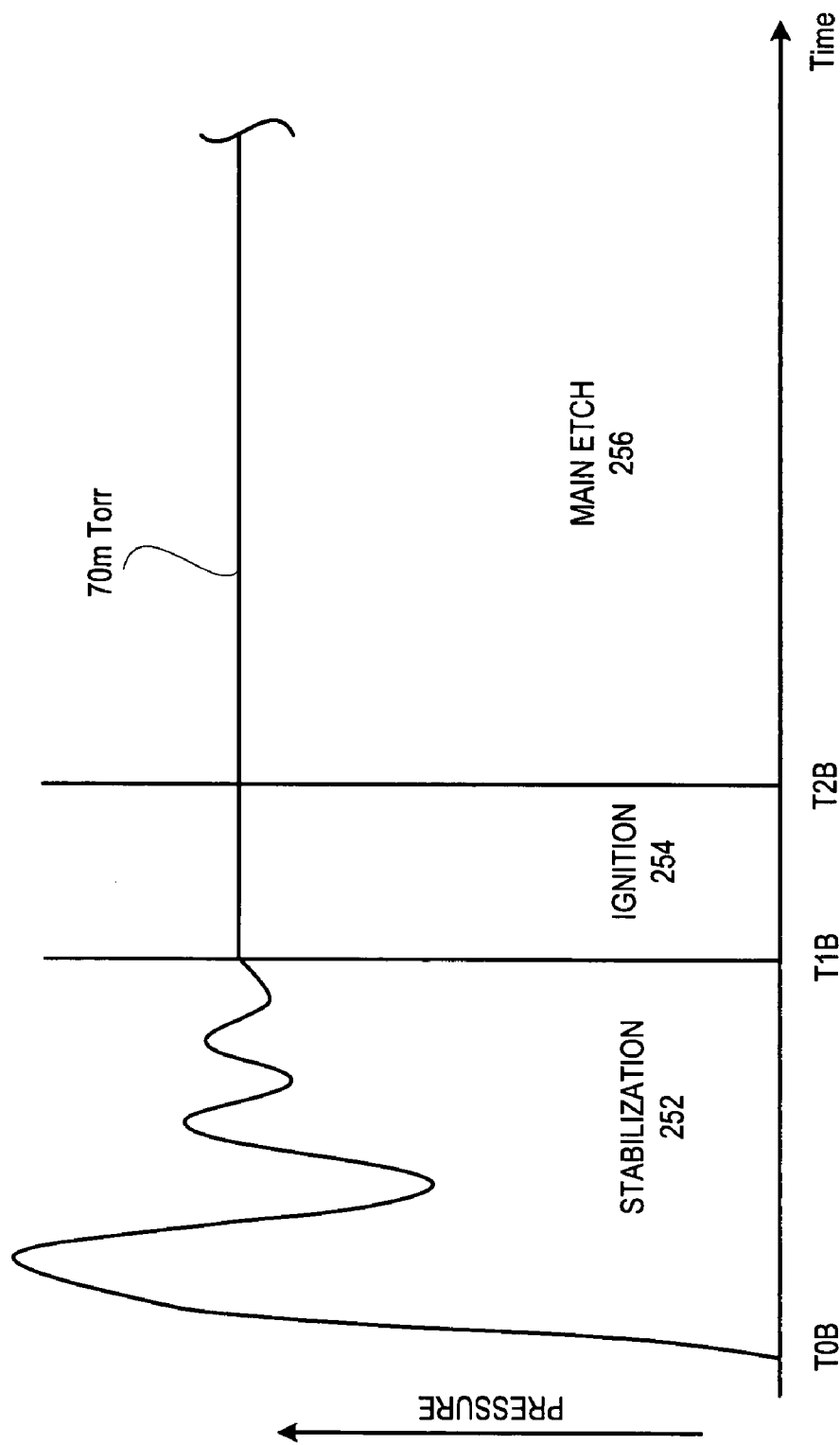

REDUCING PLASMA IGNITION PRESSURE

BACKGROUND OF THE INVENTION

Plasma has long been employed in plasma processing equipment to process substrates (e.g., semiconductor substrates, flat panel substrates, nano-machinery substrates, and the like) into useful devices (e.g., integrated circuits, flat panels, nano-machines, and the like). Up to now, plasma ignition has taken place at a relatively high chamber pressure, for example at 120 mTorr for a 2300 Exelan®-series plasma processing system, which is available from Lam Research Corporation of Fremont, Calif.

One of the reasons for requiring a high chamber pressure for plasma ignition is that plasma ignition has been unreliable at lower pressures. This is due to a low reactor gap, the use of relatively low RF frequencies for plasma generation and the fact that the RF energy is being coupled into the plasma capacitively. However, the high chamber pressure at which plasma is ignited in the prior art creates certain processing challenges. For example, a high chamber pressure may reduce etch directionality and contribute to higher level of polymer formation on the substrate surface, leading to etch inconsistencies such as etch stop and anomalous RF plasma formations.

As technology progresses and etch requirements become more exact, the reduced etch directionality and the higher level of polymer formation become significant disadvantages. This statement is particularly true for processes that require a low process pressure during the plasma step, e.g., below 50 mTorr in some cases. The pressure can be lowered during a processing step (e.g., to about 60 mTorr) but the requirement of a high pressure ignition step still adds an additional step to the overall etch process, which disadvantageously increases the overall etch time. Furthermore, the higher pressure ignition step may require a challenging transition phase in which the process pressure will have to be reduced to its target magnitude. In addition, excessive polymer may be formed on surfaces during the high pressure phase leading to problems such as etch stop on the wafer or anomalous plasma formation.

SUMMARY OF THE INVENTION

The invention relates, in an embodiment, to a method in a plasma processing system for processing a semiconductor substrate. The plasma processing system includes a plasma processing chamber and an electrostatic chuck coupled to a bias compensation circuit. The method includes igniting a plasma in a plasma ignition step. Plasma ignition step is performed while a first bias compensation voltage provided by the bias compensation circuit to the chuck is substantially zero and while a first chamber pressure within the plasma processing chamber is below about 90 mTorr. The method further includes processing the substrate in a substrate-processing step after the plasma is ignited. The substrate-processing step employs a second bias compensation voltage provided by the bias compensation circuit that is higher than the first bias compensation voltage and a second chamber pressure substantially equal to the first chamber pressure.

In another embodiment, the invention relates to a method for processing a substrate in a plasma processing system having a plasma processing chamber and an electrostatic chuck coupled to a bias compensation circuit. The method includes igniting a plasma while a first bias compensation voltage provided by the bias compensation circuit to the chuck is substantially zero. The method also includes processing the substrate, after the plasma is ignited, using a second bias compensation voltage provided by the bias compensation circuit that is higher than the first bias compensation voltage.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2B is a simplified diagram illustrating, in accordance with an embodiment of the present invention, the relevant steps required to process a substrate when the plasma can be ignited at a lower pressure.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. The features and advantages of the present invention may be better understood with reference to the drawings and discussions that follow.

In accordance with one aspect of the present invention, it has been discovered that if the bias compensation voltage is kept at zero, or close to zero ("substantially zero"), during the plasma ignition step, plasma ignition can be reliably achieved at a lower chamber pressure. As such, the invention works with any multi-pole electrostatic chuck that is coupled with a bias compensation circuit. The invention may also work with a mono-polar electrostatic chuck. Once ignition occurs, the bias compensation voltage may change to a value which is dependent on the specific plasma conditions and may be significantly different than zero. Since plasma ignition can take place at a low pressure and even at the same pressure set point required during the etch step, there is no need to spend time lowering the chamber pressure from the high ignition pressure to the lower etch pressure. Accordingly, the overall etch time may be substantially reduced. In a non-obvious fashion, igniting the plasma at a lower pressure set point while keeping the bias compensation voltage at zero or substantially zero also reduces the time required to ignite the plasma, resulting in an even lower overall etch time.

Figure 1:
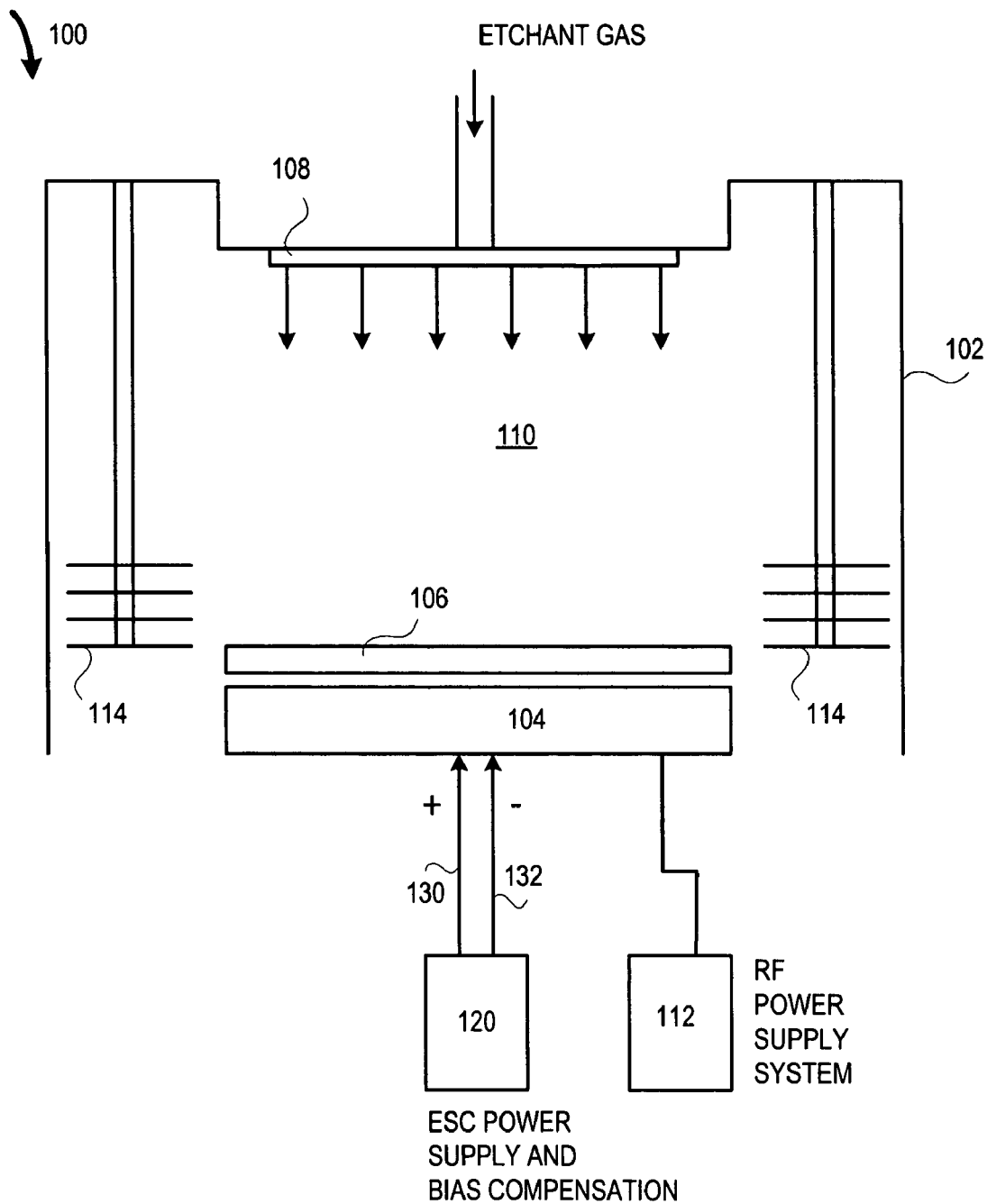
FIG. 1 shows a typical prior art plasma processing system, which includes a plasma processing chamber and a chuck on which a substrate is disposed.

The advantages and features of the invention may be better understood with reference to the figures and discussions that follow. FIG. 1 shows a typical prior art plasma processing system 100, which includes a plasma processing chamber 102 and a chuck 104 on which a substrate 106 is disposed. There is a shower head 108 for providing the etchant gases into the chamber interior 110. An RF power supply system 112 (typically including RF generators and corresponding match networks) provides RF power to chuck 104. The ignited plasma is confined by a set of confinement rings 114.

FIG. 1 also shows the power supply for the electrostatic chuck 120, which includes a current supply and a bias compensation circuit. In the case of FIG. 1, chuck 104 is a bi-polar electrostatic chuck (ESC) which has a positive pole and a negative pole. As is well-known with electrostatic chucks, positive and negative voltages (e.g., +300V and −300V) supplied to these poles provide an electrostatic clamping force, which clamps substrate 106 to chuck 104. A conductor 130 provides the positive voltage to one pole of the electrostatic chuck, while a second conductor 132 provides the negative voltage to the other pole of the electrostatic chuck. The bias compensation circuit helps maintain a consistent clamping force across the substrate during plasma processing by providing a bias compensation voltage. To elaborate, different processes affect the bias voltage on the substrate differently. For example, some processes may cause the bias voltage on the substrate to become more positive, while other processes may cause the bias voltage on the substrate to become more negative. Since the clamping force between a pole of the ESC chuck and the overlying substrate region is dependent upon the difference in their respective voltage values, unless the variance in the bias voltage on the substrate is accounted for, the clamping force between the ESC's positive pole and the substrate may be lower or higher than the clamping force between the ESC's negative pole and the substrate. The differences in the clamping forces across different poles of the ESC chuck may cause the substrate to be clamped unevenly. This may result in the substrate being cooled unevenly, thereby causing the processing results to vary from region to region of the substrate. By providing a bias compensation voltage, the bias compensation circuit essentially forces the clamping force across the substrate to be equal. Bias compensation circuits are known in the art and in the patent literature, including for example U.S. Pat. No. 5,793,192.

Figure 2A:
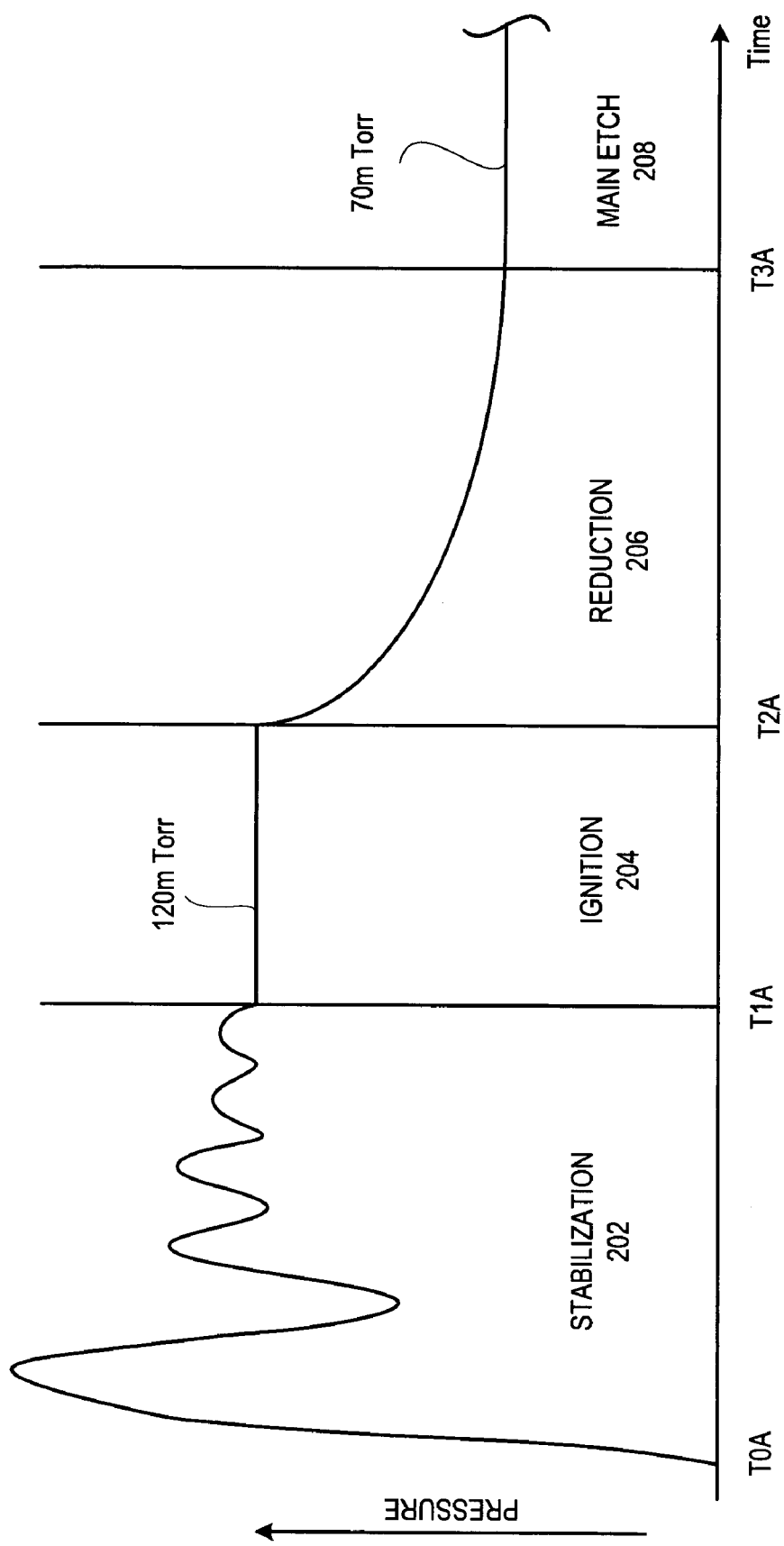
FIG. 2A is a simplified diagram showing the more relevant steps required to process a substrate when a high pressure ignition step is required.

FIG. 2A is a simplified diagram showing the more relevant steps required to process a substrate when a high pressure ignition step is required. The etch begins with a stabilization step 202 (between time T0A and T1A) during which the etchant source gas is introduced and allowed to stabilize at the higher pressure set point required for reliable plasma ignition (e.g., 120 mTorr). This stabilization step is typically on the order of 10 to 13 seconds, which is the amount of time required for the pressure control mechanism to stabilize the gas to the high pressure set point required for ignition in the prior art.

In step 204 (between time T1A and T2A), the plasma is ignited. This high-pressure ignition step typically takes about 5 seconds or so. Thereafter, the pressure is reduced to the lower chamber pressure required by the process recipe, such as 70 mTorr in this example. This pressure reduction step 206 (between time T2A and T3A) may take, for example, between 5 and 8 seconds depending on gas flow and the magnitude of the pressure change. After the pressure reduction step, the etch step 208 (starting from time T3A) is allowed to proceed at the low chamber pressure specified by the process recipe.

FIG. 2B is a simplified diagram illustrating, in accordance with an embodiment of the present invention, the relevant steps required to process a substrate when the plasma can be ignited at a lower pressure. Step 252 (between time T0B and T1B is a pressure stabilization step, which introduces the etchant gas into the plasma processing chamber. Note that the pressure stabilization step now involves a lower pressure set point and may take less time to accomplish in some cases.

In step 254 (between time T1B and T2B, the plasma is ignited at the lower chamber pressure. During this plasma ignition step 254, the bias compensation voltage provided to the ESC chuck's poles is at zero, or substantially zero. In many cases, it has been found that the time required to ignite the plasma is also less, compared to the time required to ignite plasma under high-bias conditions at the substrate as has been done in the prior art (e.g., about 2 seconds versus about 5 seconds in one example).

In most cases, the pressure at which the plasma is ignited is substantially the same as the chamber pressure required for the etch step, thereby eliminating any subsequent pressure reduction step. Even if the lower plasma ignition pressure is different from the chamber pressure required for the etch step, the fact that plasma ignition takes place at a lower chamber pressure reduces the amount of time required to reduce the pressure to the pressure set point required for the etch step.

In step 256 (after time T2B), the etch is performed. This etch step is similar to the etch step 208 of FIG. 2A. A zero or substantially zero bias voltage is only provided up until the incipient ignition. As soon as plasma is lit the bias compensation circuit of the power supply will drive the bias voltage to a value close to the actual bias voltage sensed by the wafer from the generation of the plasma sheath. Accordingly, there is no change to the process recipe, and the bias is still compensated for during the etch step. Furthermore, it has been found that the elimination of the high pressure ignition step widens the process window, allowing the process engineer wider latitude to design an appropriate process recipe for a required etch.

Figure 3:
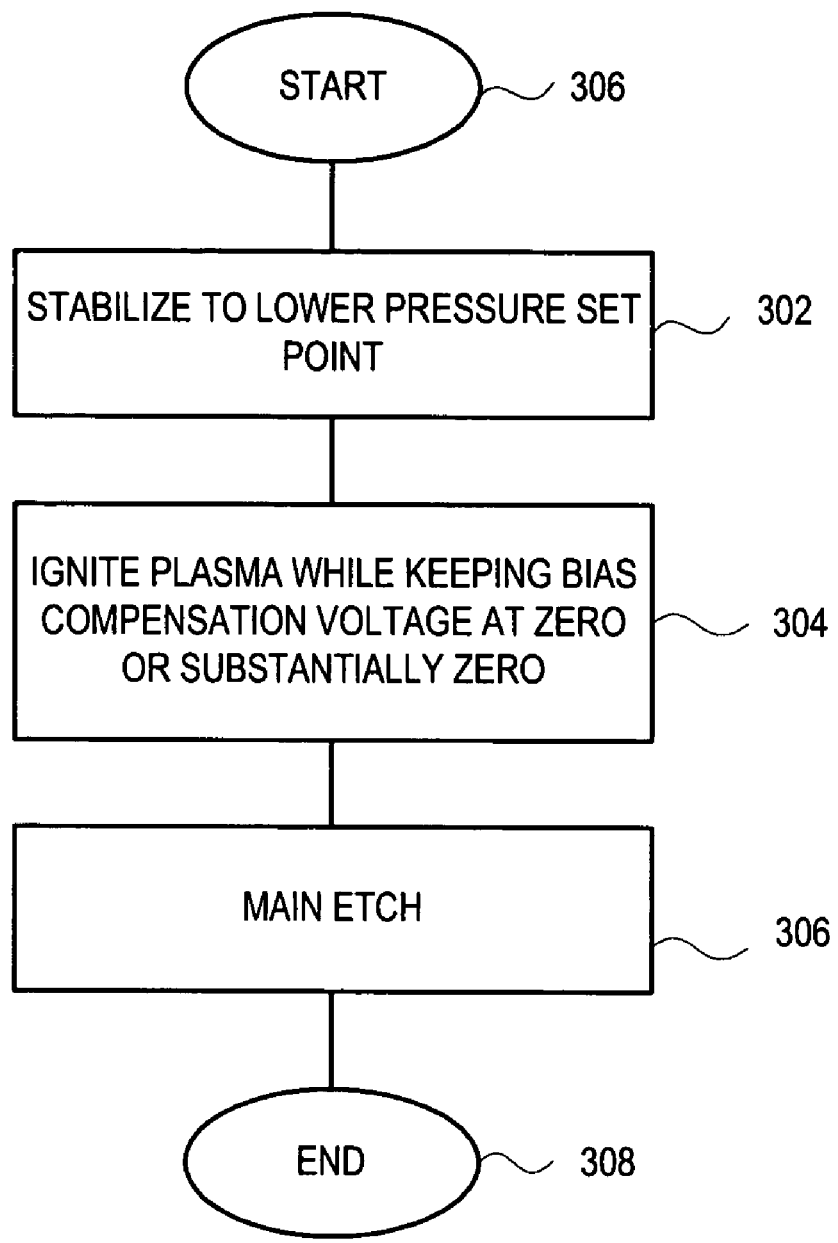
FIG. 3 shows in a simplified flowchart format, in accordance with an embodiment of the present invention, the steps for etching in a plasma processing system that does not require a high pressure ignition step.

FIG. 3 shows in a simplified flowchart format, in accordance with an embodiment of the present invention, the steps for etching in a plasma processing system that does not require a high pressure ignition step. In step 302, the stabilization step is performed. This stabilization step is analogous to that discussed in connection with reference number 252 of FIG. 2B. After stabilization, the plasma is ignited in an ignition step 304 at the lower pressure set point while the bias compensation voltage is kept at zero or substantially zero. In one embodiment, the ignition pressure is between about 40 mTorr and about 90 mTorr. In another embodiment, the ignition pressure is between about 50 mTorr and about 80 mTorr. In yet another embodiment, the ignition pressure is between about 60 mTorr and about 70 mTorr.

In step 306, the etch step commences with the bias compensation voltage being controlled by the bias compensation circuit of the electrostatic chuck power supply to a value that may be significantly different from zero. If the ignition pressure is slightly higher than the chamber pressure required for the etch step, a short pressure reduction step may also be optionally performed before the etch step, as mentioned earlier.

As can be appreciated by the foregoing, embodiments of the invention eliminate the high pressure ignition step, along with its concomitant disadvantages such as excessive polymer formation and low etch directionality. By setting the bias compensation voltage of the ESC's bias compensation circuit at zero or near zero and coincidentally making the wafer be near zero volts also, plasma can be reliably ignited at a lower pressure. Since there is no need to reduce the chamber pressure from the high ignition pressure to the lower etch pressure, less time is required for the overall etch process. Furthermore, it has been found that with the bias compensation voltage at zero or substantially zero and the lower ignition pressure, less time is required for the ignition step. These contribute to an etch process that is capable of a wider process window and a reduced overall etch time, both of which are highly advantageous for the industry.

While this invention has been described in terms of several preferred embodiments, there are alterations, permutations, and equivalents which fall within the scope of this invention. For example, although the specific implementation has been discussed in connection with etching as the substrate-processing step, the invention also applies to other substrate-processing techniques (e.g., deposition, cleaning, polymerization, or any other processing) whereby plasma ignition is required. Further, even though the specific example is illustrated in the context of a 2300 Exelan®-series plasma processing system, the invention may also be employed in other plasma processing systems, including those employing inductively-coupled plasma, capacitively-coupled plasma, ECR-generated (electron-cyclotron resonance) plasma, and/or other types of plasma generating technologies. It should also be noted that there are many alternative ways of implementing the apparatuses of the present invention. It is therefore intended that the following appended claims be interpreted as including all such alterations, permutations, and equivalents as fall within the true spirit and scope of the present invention.

What is claimed is:

1. In a plasma processing system having a plasma processing chamber and an electrostatic chuck coupled to a bias compensation circuit, a method for processing a semiconductor substrate, comprising:

igniting a plasma in a plasma ignition step, said plasma ignition step being performed while a first bias compensation voltage provided by said bias compensation circuit to said chuck is substantially zero and while a first chamber pressure within said plasma processing chamber is below about 90 mTorr;

after said plasma is ignited, processing said substrate in a substrate-processing step, said substrate-processing step employing a second bias compensation voltage provided by said bias compensation circuit that is higher than said first bias compensation voltage and a second chamber pressure substantially equal to said first chamber pressure.

2. The method of claim 1 wherein said first bias compensation voltage is employed only long enough to prepare said plasma for said substrate-processing step.

3. The method of claim 2 wherein a duration of said plasma ignition step is below about 10 seconds.

4. The method of claim 2 wherein a duration of said plasma ignition step is below about 5 seconds.

5. The method of claim 1 wherein said igniting said plasma is performed while said first bias compensation voltage is zero.

6. The method of claim 1 wherein said igniting said plasma is performed while said first chamber pressure is between about 40 mTorr and about 90 mTorr.

7. The method of claim 1 wherein said igniting said plasma is performed while said first chamber pressure is between about 50 mTorr and about 80 mTorr.

8. The method of claim 1 wherein said igniting said plasma is performed while said first chamber pressure is between about 60 mTorr and about 60 mTorr.

9. The method of claim 1 wherein said igniting said plasma is performed while said first chamber pressure is below about 60 mTorr.

10. The method of claim 1 wherein said igniting said plasma is performed while said first chamber pressure is below about 50 mTorr.

11. The method of claim 1 wherein said plasma processing system represents an inductively-coupled plasma processing system.

12. The method of claim 1 wherein said plasma processing system represents a capacitively-coupled plasma processing system.

13. The method of claim 1 wherein said plasma processing system represents an ECR plasma processing system.

14. The method of claim 1 wherein said electrostatic chuck is a multi-polar electrostatic chuck.

15. The method of claim 1 wherein said electrostatic chuck is a bi-polar electrostatic chuck.

16. The method of claim 1 wherein said electrostatic chuck is a mono-polar electrostatic chuck.

17. The method of claim 1 wherein said processing represents an etch application.

18. The method of claim 1 wherein said substrate represents a semiconductor wafer for producing integrated circuit.

19. The method of claim 1 wherein said substrate represents a flat panel substrate for producing at least one flat panel display product.

20. The method of claim 1 wherein said substrate represents a nano-machine substrate for producing nano-machines.

21. In a plasma processing system having a plasma processing chamber and an electrostatic chuck coupled to a bias compensation circuit, a method for processing a substrate, comprising:

igniting a plasma while a first bias compensation voltage provided by said bias compensation circuit to said chuck is substantially zero;

after said plasma is ignited, processing said substrate using a second bias compensation voltage higher than said first bias compensation voltage.

22. The method of claim 21 wherein said first bias compensation voltage is employed only long enough to ignite said plasma.

23. The method of claim 21 wherein said igniting said plasma is performed while said first bias compensation voltage is zero.

24. The method of claim 21 wherein said igniting said plasma is performed while a chamber pressure within said plasma processing chamber is between about 40 mTorr and about 90 mTorr.

25. The method of claim 21 wherein said igniting said plasma is performed while a chamber pressure within said plasma processing chamber is between about 50 mTorr and about 80 mTorr.

26. The method of claim 21 wherein said igniting said plasma is performed while a chamber pressure within said plasma processing chamber is between about 60 mTorr and about 60 mTorr.

27. The method of claim 21 wherein said igniting said plasma is performed while a chamber pressure within said plasma processing chamber is below about 60 mTorr.

28. The method of claim 21 wherein said igniting said plasma is performed while a chamber pressure within said plasma processing chamber is below about 50 mTorr.

29. The method of claim 21 wherein said processing said substrate is performed at substantially the same chamber pressure as a chamber pressure that exists during said igniting said plasma.

30. The method of claim 21 wherein said plasma processing system represents an inductively-coupled plasma processing system.

31. The method of claim 21 wherein said plasma processing system represents a capacitively-coupled plasma processing system.

32. The method of claim 21 wherein said plasma processing system represents an ECR plasma processing system.

33. The method of claim 21 wherein said electrostatic chuck is a multi-pole electrostatic chuck.

34. The method of claim 21 wherein said electrostatic chuck is a bi-polar electrostatic chuck.

35. The method of claim 21 wherein said electrostatic chuck is a mono-polar electrostatic chuck.

36. The method of claim 21 wherein said processing represents an etch application.

37. The method of claim 21 wherein said substrate represents a semiconductor wafer for producing integrated circuit.

38. The method of claim 21 wherein said substrate represents a flat panel substrate for producing at least one flat panel display product.

39. The method of claim 21 wherein said substrate represents a nano-machine substrate for producing nano-machines.

* * * * *